United States Patent
Wang (10) Patent No.: US 9,535,444 B2
(45) Date of Patent: Jan. 3, 2017

(54) DIFFERENTIAL OPERATIONAL AMPLIFIER AND BANDGAP REFERENCE VOLTAGE GENERATING CIRCUIT

(71) Applicant: Silicon Motion Inc., Hsinchu County (TW)

(72) Inventor: Chiao-Hsing Wang, Taoyuan County (TW)

(73) Assignee: Silicon Motion Inc., Hsinchu County (TW)

( * ) Notice: Subject to any disclaimer, the term of this patent is extended or adjusted under 35 U.S.C. 154(b) by 243 days.

(21) Appl. No.: 14/322,935

(22) Filed: Jul. 3, 2014

(65) Prior Publication Data

US 2015/0185753 A1 Jul. 2, 2015

(30) Foreign Application Priority Data

Dec. 27, 2013 (TW) .............. 102148813 A (51) Int. Cl.
*G05F 3/16* (2006.01)
*H03F 1/30* (2006.01)
*H03F 3/45* (2006.01)

(52) U.S. Cl.
CPC .............. *G05F 3/16* (2013.01); *H03F 1/301* (2013.01); *H03F 3/45183* (2013.01); *H03F 2200/447* (2013.01); *H03F 2203/45286* (2013.01); *H03F 2203/45612* (2013.01)

(58) Field of Classification Search
CPC .............. G05F 3/16; G05F 3/30; H03F 1/301; H03F 3/45183; H03F 3/45269; H03F 2200/447; H03F 2203/45612; H03F 2203/45286

See application file for complete search history.

(56) References Cited

U.S. PATENT DOCUMENTS

| 5,087,830 | A | 2/1992 | Cave | |
|---|---|---|---|---|
| 7,692,481 | B2* | 4/2010 | Roh | G05F 3/30 323/312 |
| 7,755,344 | B2 | 7/2010 | Hsieh | |
| 7,839,202 | B2* | 11/2010 | Sengupta | G05F 3/30 327/539 |
| 2011/0012581 | A1* | 1/2011 | Wang | G05F 3/30 323/313 |
| 2011/0037451 | A1* | 2/2011 | Shiina | G05F 3/30 323/313 |

* cited by examiner

*Primary Examiner* — Matthew Nguyen
(74) *Attorney, Agent, or Firm* — Winston Hsu; Scott Margo (57) ABSTRACT

A differential operational amplifier, which comprises: a voltage adjusting module, coupled between a first predetermined voltage source and a second predetermined voltage source, for adjusting a first voltage via a first voltage adjusting value to generate a first adjusted voltage, and for adjusting a second voltage via a second voltage adjusting value to generate a second adjusted voltage, wherein the first voltage adjusting value and the second voltage adjusting value change corresponding to a temperature; and a differential signal computing module, coupled between the first predetermined voltage source and the second predetermined voltage source, for generating an output voltage according the first adjusted voltage and the second adjusted voltage.

14 Claims, 8 Drawing Sheets

DIFFERENTIAL OPERATIONAL AMPLIFIER AND BANDGAP REFERENCE VOLTAGE GENERATING CIRCUIT

BACKGROUND OF THE INVENTION

1. Field of the Invention

The present invention relates to a differential operational amplifier and a bandgap reference voltage generating circuit applying the differential operational amplifier, and particularly relates to a differential operational amplifier that can reduce the temperature for the input voltage and a bandgap reference voltage generating circuit applying the differential operational amplifier.

2. Description of the Prior Art

In the field of circuit design, a reference voltage generating circuit is always applied to generate an accurate reference voltage as a voltage standard for other devices. Voltage generating circuits can be classified to various kinds, and one of them is a bandgap reference voltage generating circuit. The devices inside such circuit adjusts the voltage or the current thereof responding to a temperature coefficient, such that the generated reference voltage can be kept at a stable value.

Figure 1:
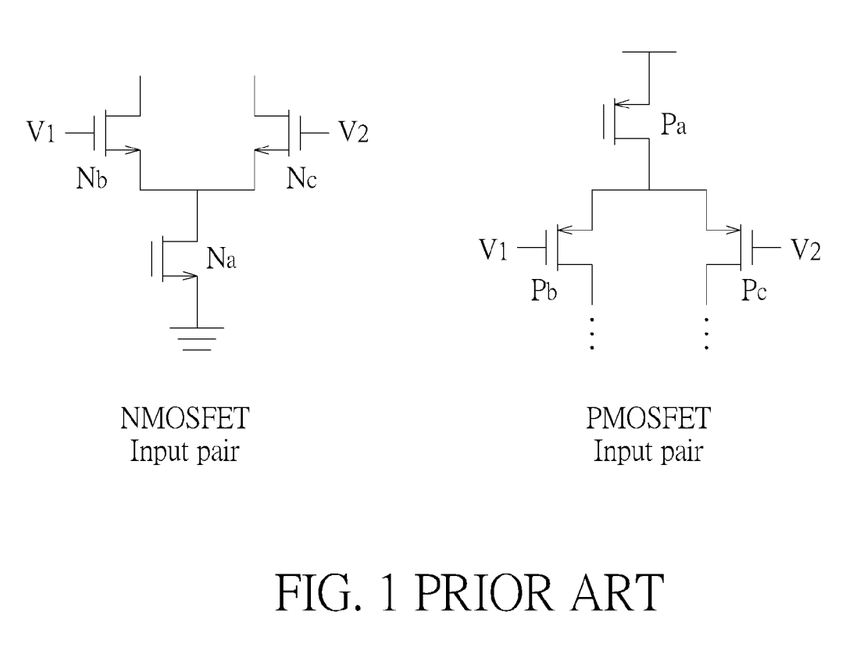
FIG. 1 is a circuit diagram illustrating a differential operational amplifier for a prior art bandgap reference voltage generating circuit.
Figure 2:
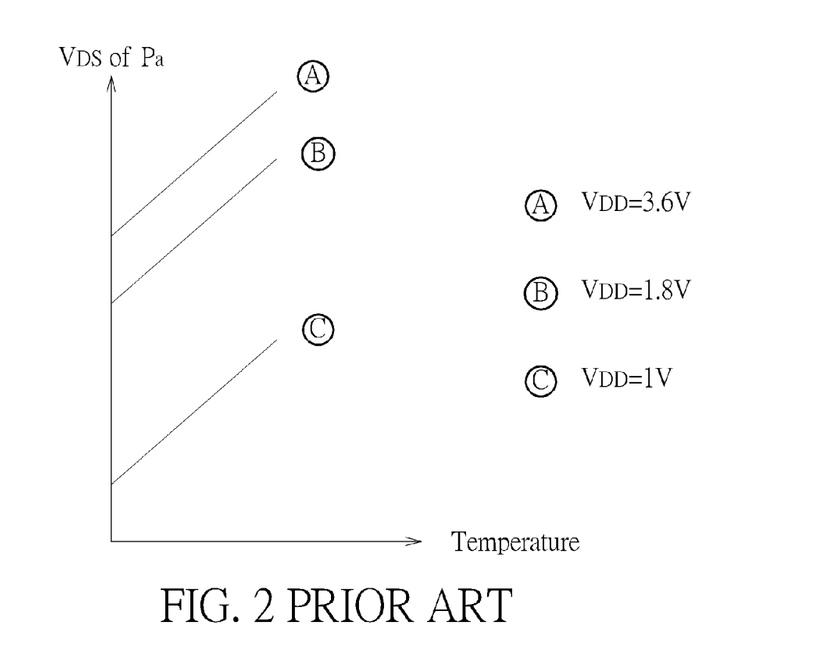
FIG. 2 is a schematic diagram illustrating a relation between a temperature and a PMOSFET's $V_{DS}$ for a prior art differential operational amplifier.

The bandgap reference voltage generating circuit always comprises a differential operational amplifier to control the operation for the bandgap reference voltage generating circuit via a first voltage and a second voltage. The first voltage and the second voltage change corresponding to a temperature difference. The differential operational amplifier always comprise the NMOSFET input pair or the PMOSFET input pair illustrated in FIG. 1 to receive above-mentioned first voltage and second voltage. Either the first voltage $V_1$ or the second voltage $V_2$ has a negative correlation with a temperature. Therefore, if the differential operational amplifier operates at a lower operational voltage $V_{DD}$ and operates at a low temperature, the voltage difference $V_{DS}$ between a source terminal and a drain terminal for the PMOSFET $P_a$ of the PMOSFET input pair is suppressed (as shown in FIG. 2), such that the PMOSFET $P_a$ operates in a linear region thus the differential operational amplifier comprises a smaller amplifier gain. On the opposite, if the differential operational amplifier operates at a high temperature, the voltage difference $V_{DS}$ between a source terminal and a drain terminal for the NMOSFET $N_a$ of the NMOSFET input pair is suppressed, such that the NMOSFET $N_a$ operates in a linear region thus the differential operational amplifier comprises a smaller amplifier gain.

Figure 3:
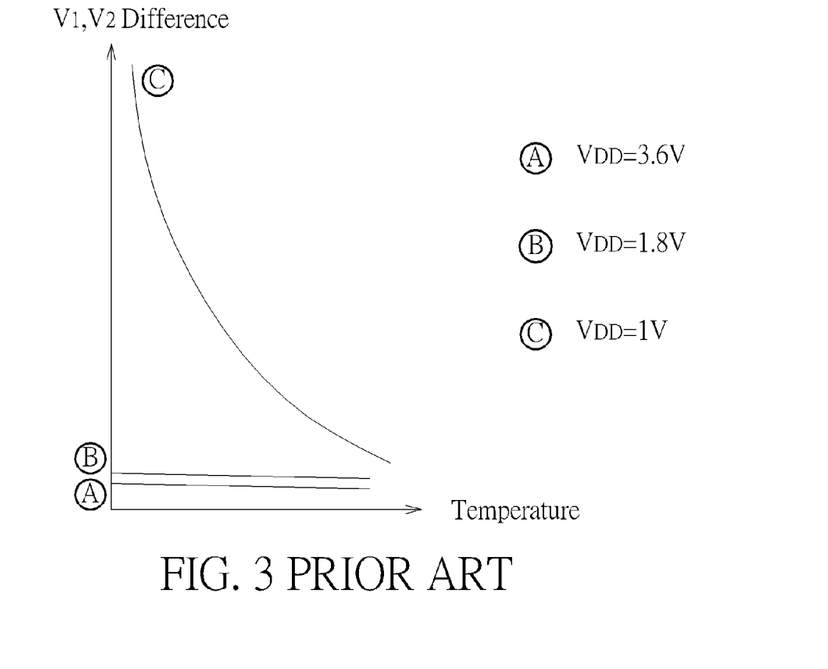
FIG. 3 is a schematic diagram illustrating a situation that a difference between the first voltage and the second voltage changes corresponding to the temperature variation, for prior art.

In the above-mentioned case, the $V_{GS}$ (the voltage difference between the gate terminal and the source terminal) must be increased, if the PMOSFET $P_a$ or the NMOSFET $N_a$ need constant output currents. However, the difference between the first voltage $V_1$ and the second voltage $V_2$ change (as shown in FIG. 3) if the $V_{GS}$ increases, thereby the reference voltage generated by the reference voltage generating circuit is also affected.

SUMMARY OF THE INVENTION

One objective of the present invention is to provide a differential operational amplifier that can decrease the level that the input changes due to the temperature.

Another objective of the present invention is to provide a differential operational amplifier that can decrease the level that the input changes due to the temperature.

One embodiment of the present invention discloses a differential operational amplifier, which comprises: a voltage adjusting module, coupled between a first predetermined voltage source and a second predetermined voltage source, for adjusting a first voltage via a first voltage adjusting value to generate a first adjusted voltage, and for adjusting a second voltage via a second voltage adjusting value to generate a second adjusted voltage, wherein the first voltage adjusting value and the second voltage adjusting value change corresponding to a temperature; and a differential signal computing module, coupled between the first predetermined voltage source and the second predetermined voltage source, for generating an output voltage according the first adjusted voltage and the second adjusted voltage.

Another embodiment of the present invention discloses a bandgap reference voltage generating circuit, which comprises a current mirror, a differential operational amplifier, a voltage generating module and a reference voltage resistance device. The current mirror generates a first current at a first current output terminal, for generating a second current at a second current output terminal, and for generating a third current at a third current output terminal, wherein the second current maps from the first current and the third current maps from the first current or the second current. The differential operational amplifier comprises: an operational output terminal; a first operational input terminal; a second operational input terminal; a voltage adjusting module, coupled between a first predetermined voltage source and a second predetermined voltage source, for adjusting a first voltage via a first voltage adjusting value to generate a first adjusted voltage, and for adjusting a second voltage via a second voltage adjusting value to generate a second adjusted voltage, wherein the first voltage adjusting value and the second voltage adjusting value change corresponding to a temperature; and a differential signal computing module, coupled between the first predetermined voltage source and the second predetermined voltage source, for generating a control voltage according the first adjusted voltage and the second adjusted voltage.

The voltage generating module, generates a first voltage at the first operational input terminal according to the first current, and for generating a second voltage at the second operational input terminal according to the second current, wherein the differential operational amplifier generates the control signal to the current mirror according to the first voltage and the second voltage, to control the first current, the second current and the third current; and a reference voltage resistance device, comprising a first terminal receiving the third current and a second terminal coupled to the second voltage source, wherein the third current generates a reference voltage at the first terminal of the reference voltage resistance device.

In view of above-mentioned description, the present invention adjusts the first and the second input voltages via at least one adjusting amount changing corresponding to the temperature variation. Thereby the firs input voltage and the second input voltage have less difference corresponding to the temperature variation, thus the suppressing for the $V_{DS}$ of the transistor in the differential operational amplifier decreases. By this way, the differential operational amplifier can have a better performance, and the bandgap reference voltage generating circuit applying the differential operational amplifier can generate a more stable reference voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
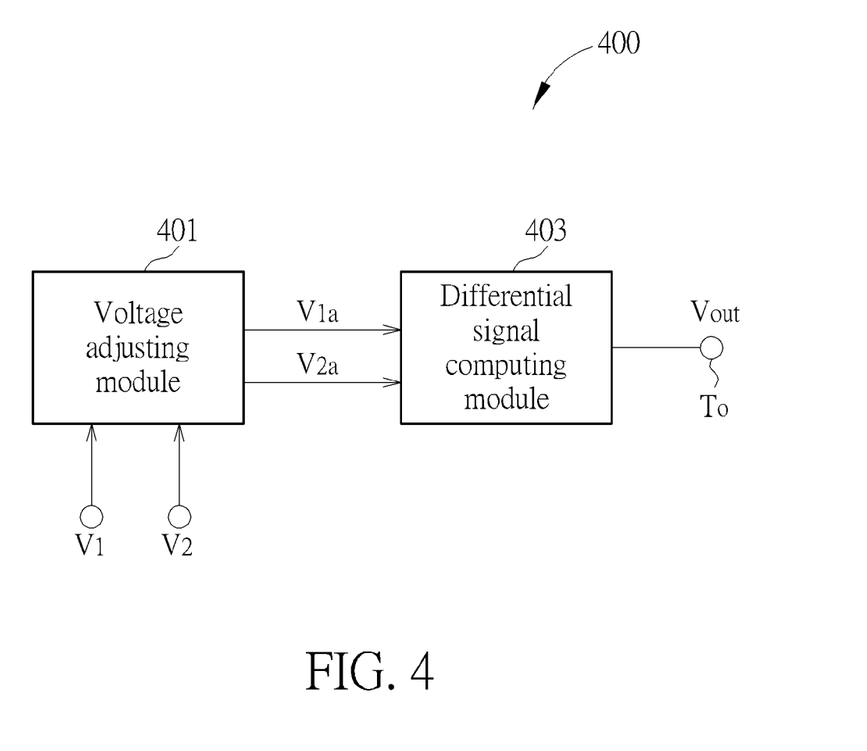
FIG. 4 is a block diagram illustrating a differential operational amplifier, according to one embodiment of the present invention.

FIG. 4 is a block diagram illustrating a differential operational amplifier 400, according to one embodiment of the present invention. As shown in FIG. 4, the differential operational amplifier 400 comprises a voltage adjusting module 401 and a differential signal computing module 403. The voltage adjusting module 401 is coupled between a first predetermined voltage source and a second predetermined voltage source ($V_{DD}$ and GND, not illustrated in FIG. 4), for adjusting a first voltage $V_1$ via a first voltage adjusting value to generate a first adjusted voltage $V_{1a}$, and for adjusting a second voltage $V_2$ via a second voltage adjusting value to generate a second adjusted voltage $V_{2a}$. The first voltage adjusting value and the second voltage adjusting value change corresponding to a temperature. The differential signal computing module 403 is coupled between the first predetermined voltage source and the second predetermined voltage source, for generating an output voltage $V_{out}$ according the first adjusted voltage $V_{1a}$ and the second adjusted voltage $V_{2a}$ at an output terminal $T_o$.

Figure 5:
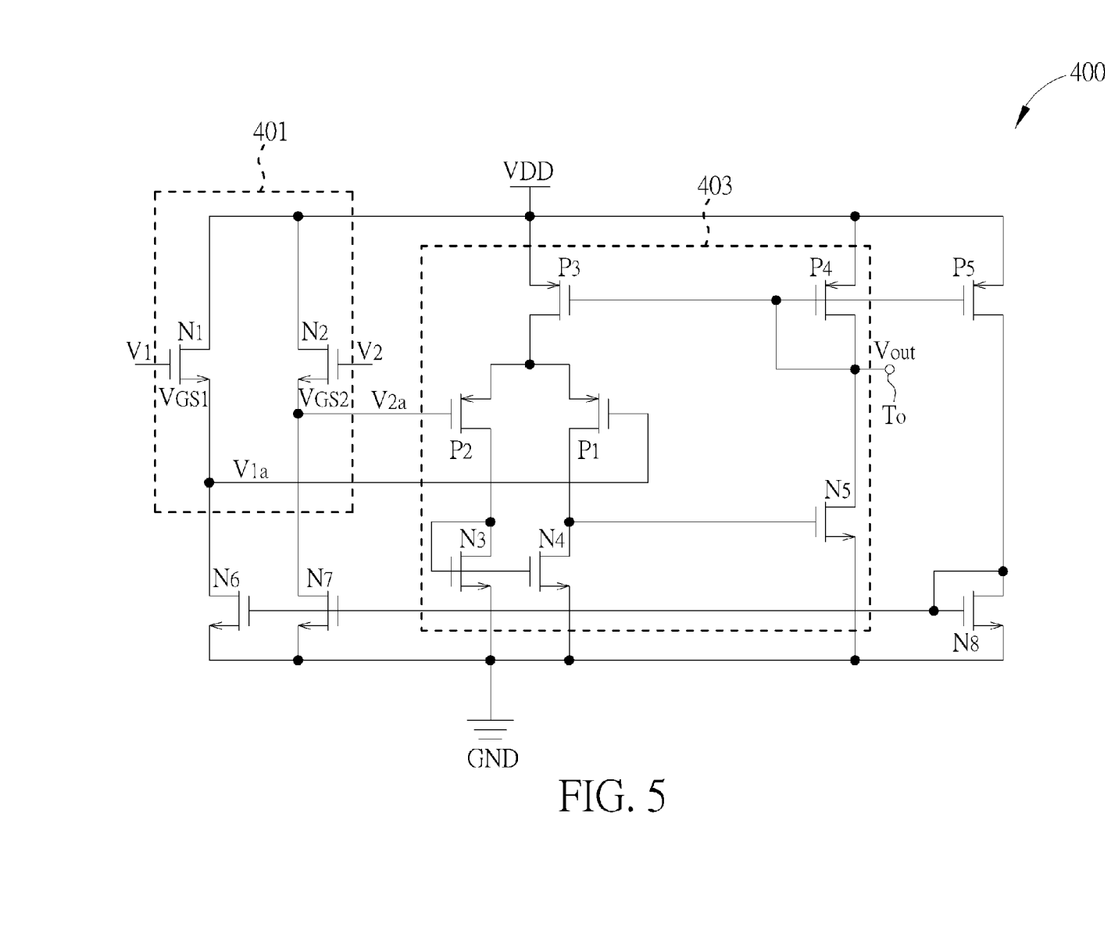
FIG. 5 is a circuit diagram illustrating a differential operational amplifier, according to one embodiment of the present invention.

FIG. 5 is a circuit diagram illustrating a differential operational amplifier, according to one embodiment of the present invention. However, please note, the circuit diagram in FIG. 5 is only for example and does not mean to limit the present invention. As shown in FIG. 5, the voltage adjusting module 401 comprises: a first NMOSFET $N_1$, comprising: a drain terminal coupled to the first predetermined voltage source $V_{DD}$, a gate terminal receiving the first voltage $V_1$, a source terminal outputting the first adjusted voltage $V_{1a}$. The first voltage adjusting value is a voltage difference $V_{GS1}$ between the gate terminal of the first NMOSFET $N_1$ and the source terminal of the first NMOSFET $N_1$. Additionally, the voltage adjusting module 401 comprises a second NMOSFET $N_2$, comprising: a drain terminal coupled to the first predetermined voltage source $V_{DD}$, a gate terminal receiving the second voltage $V_2$, a source terminal outputting the second adjusted voltage $V_{2a}$. The second voltage adjusting value is a voltage difference $V_{GS2}$ between the gate terminal of the second NMOSFET $N_2$ and the source terminal of the second NMOSFET $N_2$. Please note, the first NMOSFET $N_1$ and second NMOSFET $N_2$ can be replaced by other transistors.

The differential signal operating module 403 comprises: a first PMOSFET $P_1$, a second PMOSFET $P_2$, a third PMOSFET $P_3$, a fourth PMOSFET $P_4$, a third NMOSFET $N_3$, a fourth NMOSFET $N_4$ and a fifth NMOSFET $N_5$. The first PMOSFET $P_1$ comprises a gate terminal receiving the first adjusted voltage $V_{1a}$. The second PMOSFET $P_2$ comprises: a gate terminal receiving the second adjusted voltage $V_{2a}$, and a source terminal coupled to a source terminal of the first PMOSFET $P_1$. The third PMOSFET $P_3$ comprises: a source terminal coupled to a first predetermined voltage source $V_{DD}$, and a drain terminal coupled to the source terminal of the first PMOSFET $P_1$ and the second PMOSFET $P_2$. The fourth PMOSFET $P_4$ comprises: a source terminal coupled to the first predetermined voltage source $V_{DD}$, a gate terminal coupled to the gate terminal of the third PMOSFET, and a drain terminal coupled to the gate terminal of the third PMOSFET $P_3$ and an output terminal $T_o$. The third NMOSFET $N_3$ comprises: a drain terminal coupled to the drain terminal of the second PMOSFET $P_2$ and a gate terminal of the third NMOSFET $N_3$, and a source terminal coupled to the second predetermined voltage source GND. The fourth NMOSFET $N_4$ comprises: a drain terminal coupled to a drain terminal of the first PMOSFET $P_1$, a source terminal coupled to the second predetermined voltage source GND, and a gate terminal coupled to a base of the third NMOSFET $N_3$. The fifth NMOSFET $N_5$, comprises: a drain terminal coupled to the output terminal $T_o$, a gate terminal coupled to the drain terminal of the fourth NMOSFET $N_4$, and a source terminal coupled to the second predetermined voltage source GND.

The structure for the differential signal computing module 403 in FIG. 5 is a two stage CMOS differential operational amplifier, wherein the first PMOSFET $P_1$, the second PMOSFET $P_2$, the third PMOSFET $P_3$, the third NMOSFET $N_3$ and the fourth NMOSFET $N_4$ are included in the first stage, and the fourth PMOSFET $P_4$, the fifth NMOSFET $N_5$ are included in the second stage. The third PMOSFET $P_3$ provides a biasing voltage to the first stage amplifier, the first PMOSFET $P_1$ and the second PMOSFET $P_2$ form a differential input pair. Additionally, the third NMOSFET $N_3$ and the fourth NMOSFET $N_4$ are arranged to provide active loading and to implement a single end output transforming for the circuit. The second stage amplifier is a common source amplifier. The fourth PMOSFET $P_4$ is arranged to provide a bias voltage and for active loading.

In one embodiment, the first NMOSFET $N_1$, the second NMOSFET $N_2$, the third NMOSFET $N_3$, the fourth NMOSFET $N_4$, the fifth NMOSFET $N_5$, the sixth NMOSFET $N_6$, the seventh NMOSFET $N_7$ and the eighth NMOSFET $N_8$ operate at a 1.2 v. Also, the first PMOSFET $P_1$, the second PMOSFET $P_2$ operate at 1.2 v, and the third PMOSFET $P_3$, the fourth PMOSFET $P_4$, the fifth PMOSFET $P_5$ operate at 3.3 v. However, it is not limited.

Figure 7:
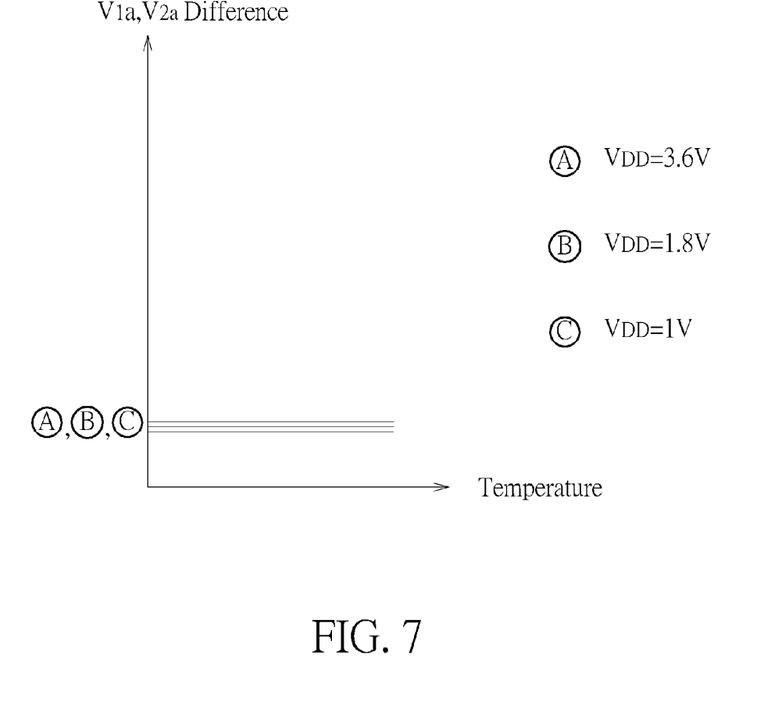
FIG. 7 is a schematic diagram illustrating a relation between a temperature and a PMOSFET's $V_{DS}$ for a differential operational amplifier according to the present invention.

As above-mentioned, the first voltage $V_1$ and the second voltage $V_2$ have a negative correlation for the temperature, thus increase while the temperature decreasing. In the embodiments, the voltage output at the output terminal $T_o$ is generated according to the first adjusted voltage $V_{1a}$ and the second adjusted voltage $V_{2a}$. Comparing with the first voltage $V_1$ and the second voltage $V_2$, the first adjusted voltage $V_{1a}$ and the second adjusted voltage $V_{2a}$ respectively minuses $V_{GS1}$ and $V_{GS2}$ for the first NMOSFET $N_1$ and the second NMOSFET $N_2$, which increase corresponding to the decreasing of the temperature. Therefore, the amount that the first adjusted voltage $V_{1a}$ and the second adjusted voltage $V_{2a}$ increase corresponding to the temperature decreases, as shown in FIG. 7 of the present invention. Accordingly, the output voltage generated at the output terminal $T_o$ can suffer less disturbance from the temperature.

The differential operational amplifier can further comprise other devices. For example, the differential operational amplifier 400 further comprises a sixth NMOSFET $N_6$ and a seventh NMOSFET $N_7$. The sixth NMOSFET $N_6$ comprises: a drain terminal coupled to the source terminal of the first NMOSFET $N_1$, and a source terminal coupled to the second voltage source GND. The seventh NMOSFET $N_7$ comprises: a drain terminal coupled to the source terminal of the second NMOSFET $N_2$, a source terminal coupled to second predetermined voltage source GND, and a base coupled to a gate terminal of the sixth NMOSFET $N_6$. The sixth NMOSFET $N_6$ and the seventh NMOSFET $N_7$ are arranged to be an equivalent resistor, to help the first NMOSFET $N_1$, the second NMOSFET $N_2$ generate currents. Additionally, the differential operational amplifier 400 further comprise a fifth PMOSFET P5 and an eighth NMOSFET $N_8$, which are applied as a buffer. The fifth PMOSFET $P_5$ comprises: a source terminal coupled to the first predetermined voltage source $V_{DD}$, a gate terminal coupled to a base of the fourth PMOSFET $P_4$. The eighth NMOSFET $N_8$ comprises: a drain terminal coupled to a drain terminal of the fifth PMOSFET and a gate terminal of the eighth NMOSFET, a source terminal coupled to the second predetermined voltage source GND.

Figure 6:
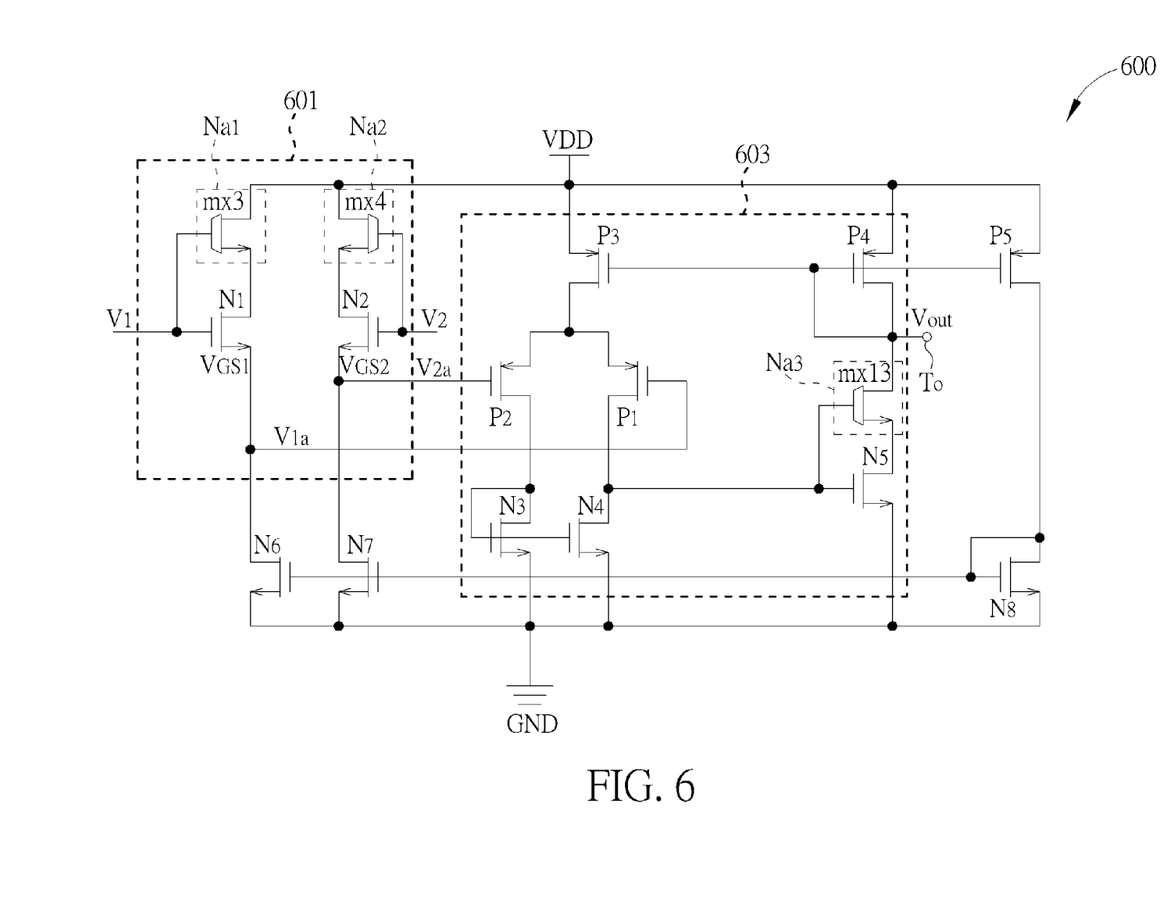
FIG. 6 is a circuit diagram illustrating a differential operational amplifier, according to another embodiment of the present invention.

The voltage adjusting module and the differential signal computing module provided by the present invention can further comprise other devices besides the devices in FIG. 5. FIG. 6 is a circuit diagram illustrating a differential operational amplifier, according to another embodiment of the present invention. As shown in FIG. 6, the voltage adjusting module 601 further comprises a first native NMOSFET $N_{a1}$ and a second native NMOSFET $N_{a2}$ besides the first NMOSFET $N_1$ and the second NMOSFET $N_2$. The first native NMOSFET $N_{a1}$ comprises: a drain terminal coupled to the first predetermined voltage source $V_{DD}$, a gate terminal coupled to the gate terminal of the first NMOSFET $N_1$, and a source terminal coupled to the drain terminal of the first NMOSFET $N_1$. The second native NMOSFET $N_{a2}$ comprises: a drain terminal coupled to the first predetermined voltage source $V_{DD}$, a gate terminal coupled to the gate terminal of the second NMOSFET $N_2$, and a source terminal coupled to the drain terminal of the second NMOSFET $N_2$. Since the conductive voltage for the native NMOSFETs, thus the first native NMOSFET $N_{a1}$ and the second native NMOSFET $N_{a2}$ can make sure the VDS for the first NMOSFET $N_1$ and the second NMOSFET $N_2$ is not over the breaking voltage. The differential signal computing module 603 further comprises a third native NMOSFET $N_{a3}$, which comprises: a drain terminal coupled to the drain terminal of the fourth PMOSFET $P_4$, a gate terminal coupled to the gate terminal of the fifth NMOSFET $N_5$, and a source terminal coupled to the drain terminal of the fifth NMOSFET $N_5$. Similarly, while operating at a high voltage environment, the third native NMOSFET $N_{a3}$ can make sure that the $V_{DS}$ of the fifth NMOSFET $N_5$ is not over the breaking voltage. In one embodiment, the first native NMOSFET $N_{a1}$, the second native NMOSFET $N_{a2}$, and the third native NMOSFET $N_{a3}$ all operate at a 3.3 v.

Figure 8:
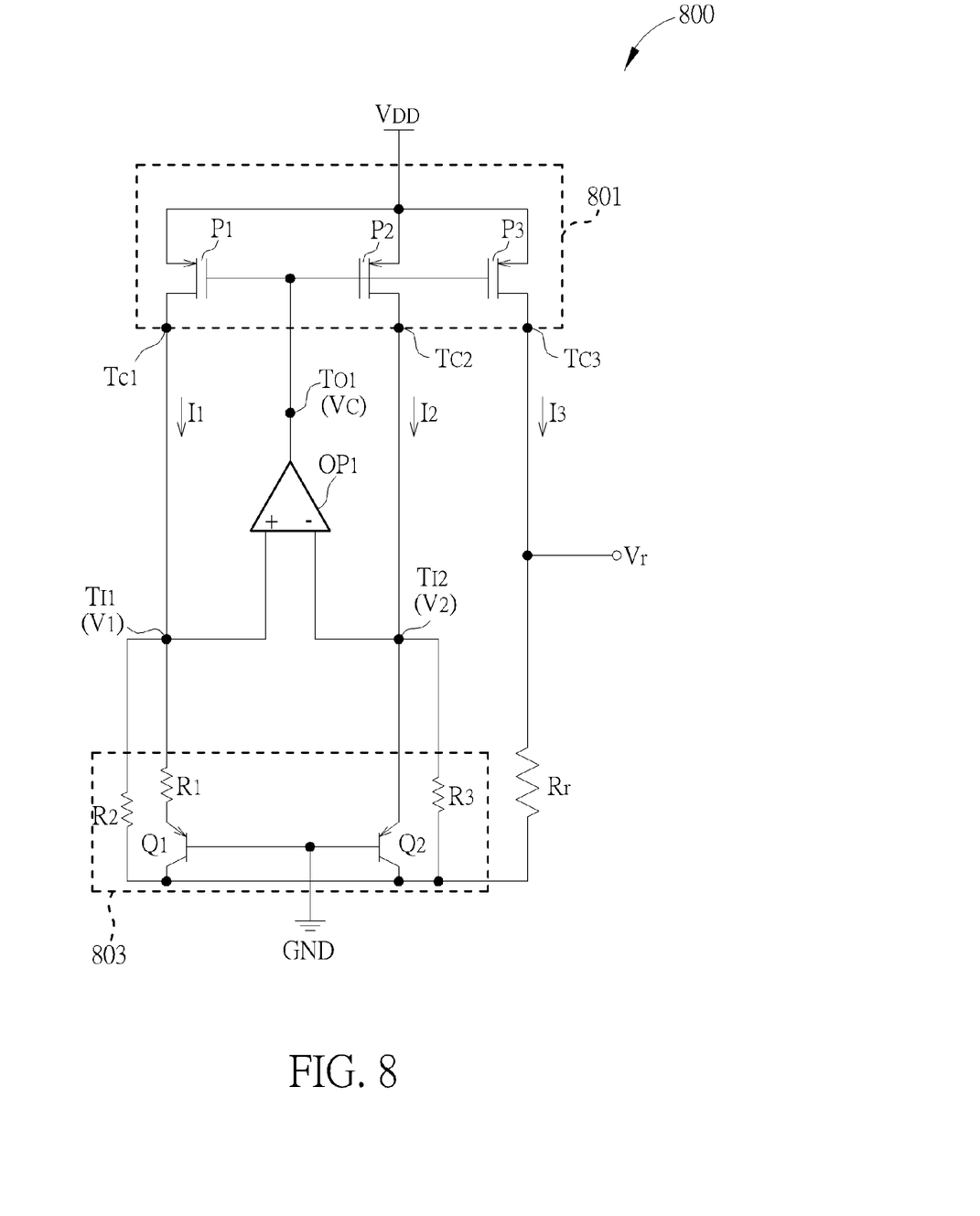
FIG. 8 is circuit diagram illustrating a bandgap reference voltage generating circuit applying the differential operational amplifier according to the present invention.

FIG. 8 is circuit diagram illustrating a bandgap reference voltage generating circuit applying the differential operational amplifier according to the present invention. As shown in FIG. 8, the bandgap reference voltage generating circuit 800 comprises a current mirror 801, a differential operational amplifier OP, an input voltage generating module 803 and a reference voltage resistance device $R_r$. The current mirror 801 receives a first predetermined voltage $V_{DD}$ and generates a first current $I_1$ at a first current output terminal $T_{c1}$, generates a second current $I_2$ at a second current output terminal $T_{c2}$, and generates a third current $I_3$ at a third current output terminal $T_{c3}$. The second current $I_2$ maps from the first current $I_1$, and the third current $I_3$ maps from the first current $I_1$ or the second current $I_2$. The differential operational amplifier comprises: an operational output terminal $T_{o1}$, a first operational input terminal $T_{11}$ and a second operational input terminal $T_{12}$. The input voltage adjusting module 803 generates a first voltage $V_1$ at the first operational input terminal $T_{11}$ according to the first current $I_1$, and generates a second voltage $V_2$ at the second operational input terminal $T_{12}$ according to the second current $I_2$. The differential operational amplifier OP generates a control voltage $V_c$ at the operational output terminal $T_{o1}$ according to the first voltage $V_1$ and the second voltage $V_2$ (i.e. the output voltage $V_{out}$ in FIG. 4) to the current mirror 801 to control the first current $I_1$, the second current $I_2$ and the third current $I_3$. In the following embodiment, the first voltage $V_1$ and the second voltage $V_2$ are the same due to the virtual short of the differential operational amplifier OP, thus the first current $I_1$ and the second current $I_2$ are the same. Additionally, the third current $I_3$ maps from the second current $I_2$ and is the same as the second current $I_2$, but not limited. A reference voltage $V_r$ is generated while the third current $I_3$ flowing through the reference voltage resistance device $R_r$. Furthermore, the differential operational amplifier OP can comprise the circuits as above-mentioned description.

In one embodiment, the current mirror 801 comprises a PMOSFET $P_o$, the PMOSFET $P_Q$ and the PMOSFET $P_R$. The PMOSFET $P_o$ comprises: a source terminal coupled to the first predetermined voltage $V_{DD}$, a drain terminal as the first current output terminal $T_{c1}$, and a gate terminal receiving the control voltage $V_c$. The PMOSFET $P_Q$ comprises: a source terminal coupled to the first predetermined voltage $V_{DD}$, a drain terminal as the second current output terminal $T_{c2}$, and a gate terminal receiving the control voltage $V_c$. The PMOSFET $P_R$ comprises: a source terminal coupled to the first predetermined voltage $V_{DD}$, a drain terminal as the third current output terminal $T_{c2}$, and a gate terminal coupled to a base of the PMOSFET $P_Q$.

In one embodiment, the input voltage generating module 803 comprises: a first resistance device $R_1$, a second resistance device $R_2$, a third resistance device $R_3$, a first BJT $Q_1$ and a second BJT $Q_2$. The first terminal of the resistance device $R_1$ is coupled to the first operational input terminal $T_{I1}$. The collecting terminal of the first BJT $Q_1$ is coupled to a second terminal of the first resistance device $R_1$, and the emitting terminal of the first BJT $Q_1$ is coupled to a second predetermined voltage GND. The second resistor $R_2$ comprises a first terminal coupled to the first operational input terminal $T_{I1}$, and a second terminal coupled to a second predetermined voltage GND. The second BJT $Q_2$ comprises: a collecting terminal coupled to the second operational input terminal $T_{I2}$, an emitting terminal coupled to the second predetermined voltage GND, and a basic terminal coupled to a basic terminal of the first BJT $Q_1$ and coupled to the second predetermined voltage GND. The third resistance device $R_3$ comprises: a first terminal coupled to the second operational input terminal $T_{I2}$, and a second terminal coupled to the second predetermined voltage GND.

The operation for the embodiment of FIG. 8 is illustrated as below. In the following embodiment, the resistance values of the second resistance device $R_2$ and the third resistance device $R_3$ are assumed to be the same, and a size of the second BJT $Q_2$ is X times for the first BJT $Q_1$. As above-mentioned, the first voltage $V_1$ and the second voltage $V_2$ are the same due to the virtual short of the differential operational amplifier OP. The currents flowing through the second resistance device $R_2$ and the third resistance device $R_3$ are the same since the second resistance device $R_2$ and the third resistance device $R_3$ have the same resistance values. Accordingly, the currents flowing through the first BJT $Q_1$ and the second BJT $Q_2$ are the same. In such case, the voltage difference between the emitting terminal of the first BJT $Q_1$ and the second BJT $Q_2$ is $V_T \ln X$, wherein $V_T$ is a thermal voltage and equals to $$\frac{KT}{q},$$

q is a Coulomb charge, K is Boltzmann's constant and T is a temperature. Thus, the voltage difference between two terminals for the first resistor $R_1$ is $V_T \ln X$.

In view of above-mentioned concept, the first current $I_1$ is $$\frac{V_T \ln X}{R_1} + \frac{V_{EB2}}{R_2},$$

wherein $V_{EB2}$ is a voltage difference between a basic terminal and an emitting terminal of the second BJT $Q_2$. The third current $I_3$ also equals to $$\frac{V_T \ln X}{R_1} + \frac{V_{EB2}}{R_2},$$

since the first current $I_1$ equals to the second current $I_2$, and the second current $I_2$ equals to the third current $I_3$. Therefore, the reference voltage $V_r$ equals $$\left[\frac{V_T \ln X}{R_1} + \frac{V_{EB2}}{R_2}\right] R_r.$$

Ideally, $V_T$ has a positive correlation with the temperature variation, and $V_{EB2}$ has a negative correlation with the temperature variation, such that the variation for the voltages counteracts with each other. By this way, the reference voltage Vr can be kept at a constant value regardless of the temperature variation. As above-mentioned, the first voltage $V_1$ and the second voltage $V_2$ affects $V_{DS}$ for the transistor in the differential operational amplifier due the temperature variation. Therefore, the stability for the reference voltage $V_r$ if no above-mentioned calibration is performed.

Figure 9:
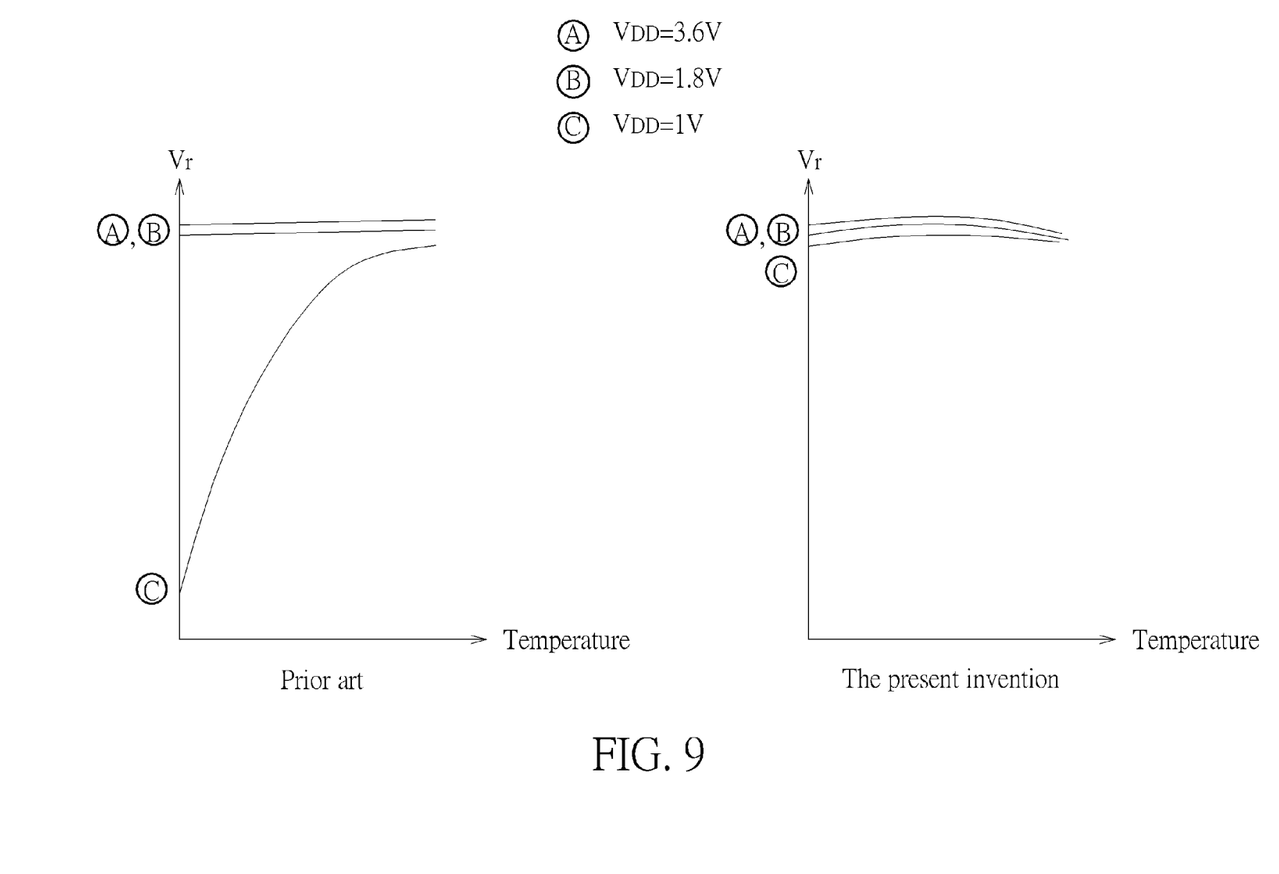
FIG. 9 is a schematic diagram illustrating a comparison between the bandgap reference voltage generating circuit of the present invention and the bandgap reference voltage generating circuit for prior art.

FIG. 9 is a schematic diagram illustrating a comparison between the bandgap reference voltage generating circuit of the present invention and the bandgap reference voltage generating circuit for prior art. As shown in FIG. 9, the reference voltage for the prior art significantly changes corresponding to the temperature, therefore the reference voltage provided by the present invention is more stable.

In view of above-mentioned description, the present invention adjusts the first and the second input voltages via at least one adjusting amount changing corresponding to the temperature variation. Thereby the firs input voltage and the second input voltage have less difference corresponding to the temperature variation, thus the suppressing for the $V_{DS}$ of the transistor in the differential operational amplifier decreases. By this way, the differential operational amplifier can have a better performance, and the bandgap reference voltage generating circuit applying the differential operational amplifier can generate a more stable reference voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A differential operational amplifier, comprising:
   a voltage adjusting module, coupled between a first predetermined voltage source and a second predetermined voltage source, for adjusting a first voltage via a first voltage adjusting value to generate a first adjusted voltage, and for adjusting a second voltage via a second voltage adjusting value to generate a second adjusted voltage, wherein the first voltage adjusting value and the second voltage adjusting value change corresponding to a temperature; and
   a differential signal computing module, coupled between the first predetermined voltage source and the second predetermined voltage source, for generating an output voltage according the first adjusted voltage and the second adjusted voltage;
   wherein the voltage adjusting module comprises:
   a first transistor, comprising: a first terminal coupled to the first predetermined voltage source, a control terminal receiving the first voltage, a second terminal outputting the first adjusted voltage, wherein the first voltage adjusting value is a voltage difference between the control terminal of the first transistor and the second terminal of the first transistor; and
   a second transistor, comprising: a first terminal coupled to the first predetermined voltage source, a control terminal receiving the second voltage, a second terminal outputting the second adjusted voltage, wherein the first voltage adjusting value is a voltage difference between the control terminal of the first transistor and the second terminal of the first transistor.

2. The differential operational amplifier of claim 1, wherein the first transistor is a first NMOSFET, wherein the first terminal of the first transistor is a drain terminal, the control terminal of the first transistor is a gate terminal, and the second terminal of the first transistor is a source terminal;
   wherein the second transistor is a second NMOSFET, wherein the first terminal of the second transistor is a drain terminal, the control terminal of the second transistor is a gate terminal, and the second terminal of the second transistor is a source terminal.

3. The differential operational amplifier of claim 2, wherein the voltage adjusting module further comprises:
   a first native NMOSFET, comprising: a drain terminal coupled to the first predetermined voltage source, a gate terminal coupled to the gate terminal of the first NMOSFET, and a source terminal coupled to the drain terminal of the first NMOSFET; and a second native NMOSFET, comprising: a drain terminal coupled to the first predetermined voltage source, a gate terminal coupled to the gate terminal of the second NMOSFET, and a source terminal coupled to the drain terminal of the second NMOSFET.

4. The differential operational amplifier of claim 1, wherein the differential signal operating module comprises:

a first PMOSFET, comprising a gate terminal receiving the first adjusted voltage;

a second PMOSFET, comprising: a gate terminal receiving the second adjusted voltage, and a source terminal coupled to a source terminal of the first PMOSFET;

a third PMOSFET, comprising: a source terminal receiving the first adjusted voltage, and a drain terminal coupled to the source terminal of the first PMOSFET and the second PMOSFET;

a fourth PMOSFET, comprising: a source terminal coupled to the first predetermined voltage source, a gate terminal coupled to the gate terminal of the third PMOSFET, and a drain terminal coupled to the gate terminal of the third PMOSFET and an output terminal;

a third NMOSFET, comprising: a drain terminal coupled to the drain terminal of the second PMOSFET and a gate terminal of the third NMOSFET, and a source terminal coupled to the second predetermined voltage source;

a fourth NMOSFET, comprising: a drain terminal coupled to the drain terminal of the first PMOSFET, a source terminal coupled to the second predetermined voltage source, and a gate terminal coupled to a base of the third NMOSFET;

a fifth NMOSFET, comprising: a drain terminal coupled to the output terminal, a gate terminal coupled to the drain terminal of the fourth NMOSFET, and a source terminal coupled to the second predetermined voltage source.

5. The differential operational amplifier of claim 4, wherein the differential signal computing module comprises:

a third native NMOSFET, comprising: a drain terminal coupled to the drain terminal of the fourth PMOSFET, a gate terminal coupled to the gate terminal of the fifth NMOSFET, and a source terminal coupled to the drain terminal of the fifth NMOSFET.

6. The differential operational amplifier of claim 5, further comprising:

a sixth NMOSFET, comprising: a drain terminal coupled to the source terminal of the first NMOSFET, and a source terminal coupled to the second voltage source; and a seventh NMOSFET, comprising: a drain terminal coupled to the source terminal of the second NMOSFET, a source terminal coupled to second predetermined voltage source, and a base coupled to a gate terminal of the sixth NMOSFET.

7. The differential operational amplifier of claim 6, further comprising:

a fifth PMOSFET, comprising: a source terminal coupled to the first predetermined voltage source, a gate terminal coupled to a base of the fourth PMOSFET; and an eighth NMOSFET, comprising: a drain terminal coupled to a drain terminal of the fifth PMOSFET and a gate terminal of the eighth NMOSFET, a source terminal coupled to the second predetermined voltage source.

8. A bandgap reference voltage generating circuit, comprising:

a current mirror, for generating a first current at a first current output terminal, for generating a second current at a second current output terminal, and for generating a third current at a third current output terminal, wherein the second current maps from the first current and the third current maps from the first current or the second current;

a differential operational amplifier, comprising:
an operational output terminal;
a first operational input terminal;
a second operational input terminal;
a voltage adjusting module, coupled between a first predetermined voltage source and a second predetermined voltage source, for adjusting a first voltage via a first voltage adjusting value to generate a first adjusted voltage, and for adjusting a second voltage via a second voltage adjusting value to generate a second adjusted voltage, wherein the first voltage adjusting value and the second voltage adjusting value change corresponding to a temperature; and
a differential signal computing module, coupled between the first predetermined voltage source and the second predetermined voltage source, for generating a control voltage according the first adjusted voltage and the second adjusted voltage;

a voltage generating module, for generating a first voltage at the first operational input terminal according to the first current, and for generating a second voltage at the second operational input terminal according to the second current, wherein the differential operational amplifier generates the control signal to the current mirror according to the first voltage and the second voltage, to control the first current, the second current and the third current; and a reference voltage resistance device, comprising a first terminal receiving the third current and a second terminal coupled to the second voltage source, wherein the third current generates a reference voltage at the first terminal of the reference voltage resistance device;

wherein the voltage adjusting module comprises:

a first transistor, comprising: a first terminal coupled to the first predetermined voltage source, a control terminal receiving the first voltage, a second terminal outputting the first adjusted voltage, wherein the first voltage adjusting value is a voltage difference between the control terminal of the first transistor and the second terminal of the first transistor; and a second transistor, comprising: a first terminal coupled to the first predetermined voltage source, a control terminal receiving the second voltage, a second terminal outputting the second adjusted voltage, wherein the first voltage adjusting value is a voltage difference between the control terminal of the first transistor and the second terminal of the first transistor.

9. The bandgap reference voltage generating circuit of claim 8, wherein the first transistor is a first NMOSFET, wherein the first terminal of the first transistor is a drain terminal, the control terminal of the first transistor is a gate terminal, and the second terminal of the first transistor is a source terminal;

wherein the second transistor is a second NMOSFET, wherein the first terminal of the second transistor is a drain terminal, the control terminal of the second transistor is a gate terminal, and the second terminal of the second transistor is a source terminal.

10. The bandgap reference voltage generating circuit of claim 9, wherein the voltage adjusting module further comprises:
a first native NMOSFET, comprising: a drain terminal coupled to the first predetermined voltage source, a gate terminal coupled to the gate terminal of the first NMOSFET, and a source terminal coupled to the drain terminal of the first NMOSFET; and
a second native NMOSFET, comprising: a drain terminal coupled to the first predetermined voltage source, a gate terminal coupled to the gate terminal of the second NMOSFET, and a source terminal coupled to the drain terminal of the second NMOSFET.

11. The bandgap reference voltage generating circuit of claim 8, wherein the differential signal operating module comprises:
a first PMOSFET, comprising a gate terminal receiving the first adjusted voltage;
a second PMOSFET, comprising: a gate terminal receiving the second adjusted voltage, and a source terminal coupled to a source terminal of the first PMOSFET;
a third PMOSFET, comprising: a source terminal receiving the first adjusted voltage, and a drain terminal coupled to the source terminal of the first PMOSFET and the second PMOSFET;
a fourth PMOSFET, comprising: a source terminal coupled to the first predetermined voltage source, a gate terminal coupled to the gate terminal of the third PMOSFET, and a drain terminal coupled to the gate terminal of the third PMOSFET and an output terminal;
a third NMOSFET, comprising: a drain terminal coupled to the drain terminal of the second PMOSFET and a gate terminal of the third NMOSFET, and a source terminal coupled to the second predetermined voltage source;
a fourth NMOSFET, comprising: a drain terminal coupled to the drain terminal of the first PMOSFET, a source terminal coupled to the second predetermined voltage source, and a gate terminal coupled to a base of the third NMOSFET;
a fifth NMOSFET, comprising: a drain terminal coupled to the output terminal, a gate terminal coupled to the drain terminal of the fourth NMOSFET, and a source terminal coupled to the second predetermined voltage source.

12. The bandgap reference voltage generating circuit of claim 11, wherein the differential signal computing module comprises:
a third native NMOSFET, comprising: a drain terminal coupled to the drain terminal of the fourth PMOSFET, a gate terminal coupled to the gate terminal of the fifth NMOSFET, and a source terminal coupled to the drain terminal of the fifth NMOSFET.

13. The bandgap reference voltage generating circuit of claim 12, further comprising:
a sixth NMOSFET, comprising: a drain terminal coupled to the source terminal of the first NMOSFET, and a source terminal coupled to the second voltage source; and
a seventh NMOSFET, comprising: a drain terminal coupled to the source terminal of the second NMOSFET, a source terminal coupled to second predetermined voltage source, and a base coupled to a gate terminal of the sixth NMOSFET.

14. The bandgap reference voltage generating circuit of claim 13, further comprising:
a fifth PMOSFET, comprising: a source terminal coupled to the first predetermined voltage source, a gate terminal coupled to a base of the fourth PMOSFET; and
an eighth NMOSFET, comprising: a drain terminal coupled to a source terminal of the fifth PMOSFET and a gate terminal of the eighth NMOSFET, a source terminal coupled to the second predetermined voltage source.

* * * * *